(12) United States Patent
Chen

(10) Patent No.: US 6,329,835 B1
(45) Date of Patent: Dec. 11, 2001

(54) QUIET OUTPUT BUFFERS WITH NEIGHBOR SENSING OF WIDE BUS AND CONTROL SIGNALS

(75) Inventor: Baohua Chen, Mountain View, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/511,015

(22) Filed: Feb. 23, 2000

(51) Int. Cl.$^7$ ............................................... H03K 19/003
(52) U.S. Cl. ................................................. 326/27; 326/56
(58) Field of Search ........................... 326/26–27, 56–58, 326/83, 86–87

(56) References Cited

U.S. PATENT DOCUMENTS

| | | | |
|---|---|---|---|
| 4,871,927 | 10/1989 | Dallavalle | 327/546 |
| 4,961,010 | 10/1990 | Davis | 326/27 |
| 5,117,129 | 5/1992 | Hoffman et al. | 326/13 |
| 5,315,187 | 5/1994 | Cheng | 327/384 |
| 5,391,939 | 2/1995 | Nonaka | 326/83 |
| 5,570,043 | 10/1996 | Churchill | 326/81 |
| 5,576,635 | 11/1996 | Partovi et al. | 326/27 |
| 5,635,860 | 6/1997 | Westerwick | 326/81 |
| 5,717,343 | * 2/1998 | Kwong | 326/27 |
| 5,748,011 | 5/1998 | Takahashi et al. | 326/83 |
| 5,764,077 | 6/1998 | Andresen et al. | 326/34 |
| 5,825,215 | 10/1998 | Sugio et al. | 327/108 |
| 5,844,425 | 12/1998 | Nguyen et al. | 326/58 |
| 5,850,159 | 12/1998 | Chow et al. | 327/394 |
| 5,864,245 | 1/1999 | Watarai | 326/81 |
| 5,914,618 | 6/1999 | Mattos | 326/87 |
| 5,933,025 | 8/1999 | Nance et al. | 326/81 |
| 5,933,027 | 8/1999 | Morris et al. | 326/81 |
| 5,963,047 | 10/1999 | Kwong | 326/27 |
| 6,184,717 | * 10/1999 | Crick | 326/86 |

FOREIGN PATENT DOCUMENTS

0576204A * 12/1993 (EP) .

* cited by examiner

*Primary Examiner*—Michael Tokar
*Assistant Examiner*—James H. Cho
(74) *Attorney, Agent, or Firm*—Stuart T. Auvinen

(57) ABSTRACT

An output buffer has a large pull-down driver transistor that draws a large current. The large driver transistor is pulsed off when a neighboring pin is switching, reducing noise and ground bounce. Pulse signals and a local enable are NOR'ed together to drive the gate of the large driver. The pulse signals are routed to many output buffers in a chip. Each data input is sent to a detector slice. The detector slice normally generates a pulse when the data input changes. These pulses from individual detector slices are combined into the pulse signals. The detector slice also receives a control signal from a control input to the chip. The control input enables a latch or flip-flop in the data path from the data input to the output buffer. When the latch is enabled, changes in the data input do not immediately affect the output buffer, but must wait for a clock edge. The control input that enables the latch also controls a mux in each detector slice. The mux disables the bit slice from generating a pulse when the data input changes.

20 Claims, 8 Drawing Sheets

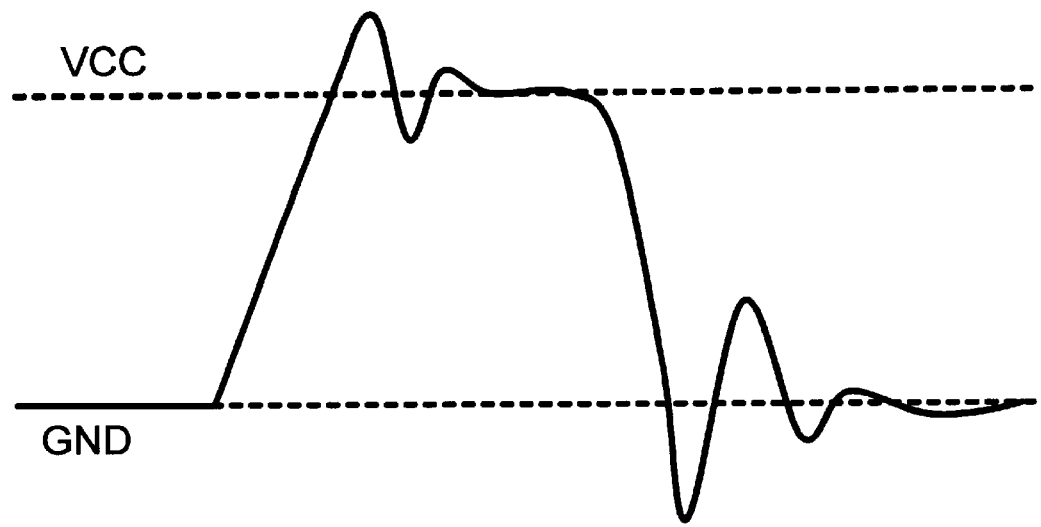
PRIOR ART   FIG. 1
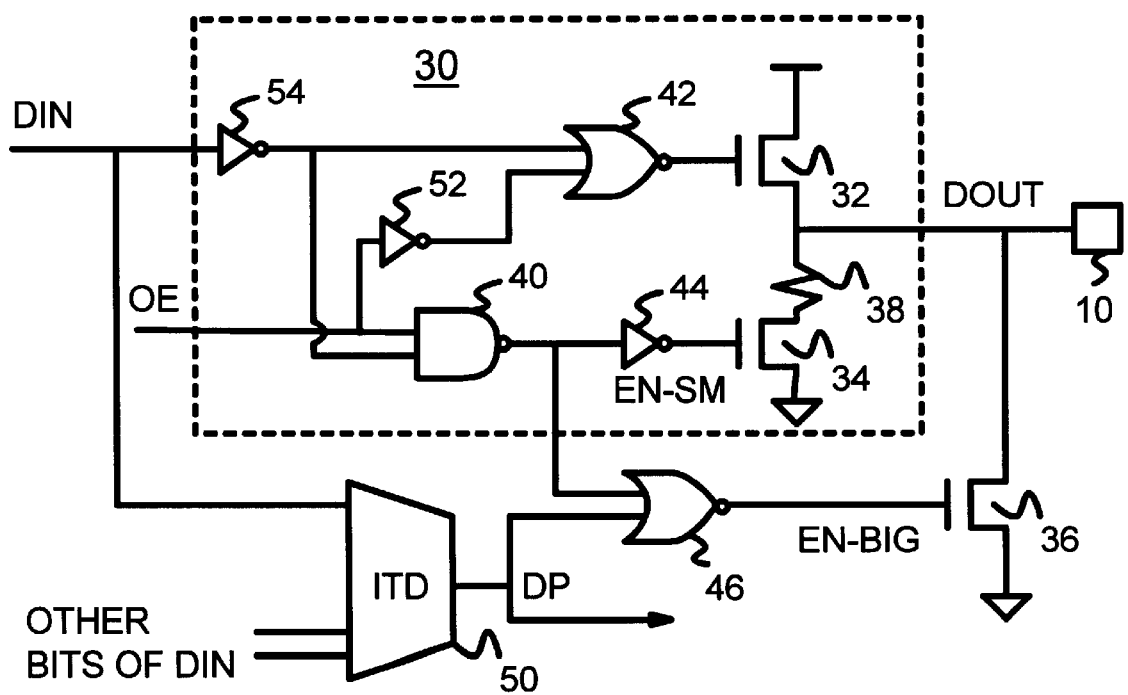
PRIOR ART   FIG. 2

QUIET OUTPUT BUFFERS WITH NEIGHBOR SENSING OF WIDE BUS AND CONTROL SIGNALS

FIELD OF THE INVENTION

This invention relates to CMOS output buffers, and more particularly to disabling neighboring output drivers to reduce noise.

BACKGROUND OF THE INVENTION

Complementary metal-oxide-semiconductor (CMOS) circuits are in widespread use today. Higher-performance systems require increased speed and current requirements for their output buffers. Higher current drive increases speed because load capacitances are more quickly charged or discharged. Unfortunately, unwanted noise often increases too.

CMOS chips with higher-drive output buffers often produce a type of noise known as ground bounce, due to rapid changes in current through the parasitic inductances of the integrated circuit (IC) package. These inductances resist changes in current by changing the voltages on power or ground supplies. Such voltage changes can falsely trigger logic within the IC device, or other devices in the system.

The rate of voltage change of the output, the edge rate, increases for these faster devices. The high edge rate can reflect off the ends of printed-circuit-board (PCB) wiring traces driven by the output buffer. These reflections produce voltage variations known as undershoot, overshoot, and ringing (oscillation). Careful layout of these wiring traces is needed to minimize trace-ends that can cause reflections. Termination devices such as resistors to ground at the ends of the traces are often used to absorb the reflect ion-causing wave front produced by the high edge rate.

FIG. 1 is a diagram of a waveform of a prior-art high-drive output buffer driving a PCB wiring trace. The high current drive of the output buffer produces a high edge rate that rapidly changes the output voltage from ground to the power-supply voltage, Vcc. The high edge rate produces a wave front that travels down the wiring trace and reflects off one or more ends. The reflected wave front then travels back up the wiring trace to the output buffer, and raises the voltage at the output buffer when the reflected wave arrives. The raised voltage is above Vcc and is known as an overshoot. This reflected wave then reverses direction and travels back to the end of the wiring trace, is reflected, and again reaches the output buffer, producing a series of both overshoots and undershoots, known as ringing. Since the reflected wave is dampened and loses energy at each reflection, the amplitude of the ringing gradually decreases. Low-going ringing (undershoot) is caused by a mis-match in impedance. Multiple reflections interfere with each other and cause the ringing.

When the output buffer switches from high to low, another high-edge rate wave travels down the wiring trace and is reflected back, producing undershoot and more ringing. This undershoot can cause ground bounce inside the output buffer's IC.

When the ringing and over/undershoot is large, logic can read a static signal as low when the static signal is actually high. For example, a static 3-volt signal input to another pin of the IC is a high signal, but when the internal ground of the IC bounces up from 0 volt to 2 volt, the static 3-volt signal appears to be a 1-volt signal, a low input. When the input signal is connected to a latch or flip-flop, the false low can be latched in, causing an error. Thus noise is a serious problem.

Several prior-art solutions to these problems are known. For example, Pierce et al., U.S. Pat. No. 5,319,252, assigned to Xilinx Inc. of San Jose, Calif., discloses an output buffer which gradually turns output buffers on and off so that there is no sharp discontinuity in the current flow. The output voltage is fed back to gradually turn off the output buffer at the end of the voltage transition. Lipp in U.S. Pat. No. 5,347,177, discloses a closed-loop trace which is driven by output buffers with level-sensitive impedance control.

While these methods are useful for controlling noise from a single output buffer, often many output buffers switch simultaneously. Simultaneous switching produces severe noise conditions and is often the worst-case. For example, if 6 of 8 outputs change at the same time, the noise from the 6 changing outputs may couple into the remaining 2 outputs, upsetting these outputs.

A solution to this problem is disclosed by Kwong et al. in U.S. Pat. No. 5,963,047, assigned to Pericom Semiconductor of San Jose, Calif. When one or more outputs change state, a short pulse is generated. The pulse is sent to other neighboring output buffers which may not be switching. The pulse temporarily disables the large drivers in these other buffers while the outputs change. Noise is reduced since the other outputs are disabled during the pulse. This solution is known as "neighbor sensing".

Schematic of Pulse-Disabled Output Buffer

FIG. 2 is a schematic diagram of a prior-art output buffer that disables the larger driver transistor using a pulse generator. The circuit diagrammed in FIG. 2 generates the waveform of FIG. 4 and was disclosed by Kwong et al. in U.S. Pat. No. 5,963,047.

An internal input signal DIN is buffered by inverter 54, which drives NOR gate 42 and NAND gate 40. An output enable OE signal is also input to NAND gate 40. Inverter 52 inverts OE for input to NOR gate 42. When OE is low, output buffer 30 is disabled and does not drive output pin 10.

NOR gate 42 drives n-channel pull-up transistor 32, which drives DOUT output pin 10 high when DIN is high and OE is high. Only one pull-up is provided because power-supply ringing is not as problematic as is ground bounce. However, two pull-down drivers are used: large driver transistor 36 and small driver transistor 34.

Output pin 10 is driven by the drain of large driver transistor 36 and by the drain of smaller driver transistor 34 through resistor 38. During and immediately after the later part of the voltage transition, when ringing occurs, large driver transistor 36 is disabled so that only small driver transistor 34 is enabled. Only small driver transistor 34 continues to drive the output low until ground is reached. Resistor 38 increases the output impedance, helping to absorb reflections.

Small driver transistor 34 thus acts as a dynamic driver transistor, being used during voltage slewing, while larger driver transistor 36 is used as a static driver to supply a large D.C. current sink after the output voltage has completed its swing.

The output from NAND gate 40 is inverted by inverter 44 and drives the gate of small driver transistor 34. The output of NAND gate 40 is also input to NOR gate 46, which drives the gate of large driver transistor 36.

Large driver transistor 36 is pulsed off by a pulse generated by input-transition detector 50. When input DIN changes from high to low, detector 50 generates a pulse DP. This pulse DP is a high-going pulse. The high-going DP pulse is input to NOR gate 46 and temporarily disabled large driver transistor 36.

Other neighboring output buffers (not shown) similar to output buffer 30 also receive the DP pulse from detector 50.

These other output buffers also have large driver transistors that are pulsed off when DIN changes. The DIN inputs to these other output buffers are also received by detector 50. Any low-going transition of any DIN for any neighboring pin generates the DP pulse and disables large driver transistors for all neighboring outputs.

Resistor 38 is in series with the output and thus serves to increase the output impedance. The higher output impedance helps dampen reflected waves and reduce ringing. Resistor 38 is sized to provide a matching impedance to the characteristic impedance of the wiring trace attached to output pin 10.

Neighbor Sensing—FIG. 3

FIG. 3 illustrates a group of neighboring output buffers that generate disabling pulses for all outputs when any output is driven low. Each output pin is driven by its own output buffer 30, which includes pull-up transistor 32, resistor 38, and small driver transistor 34 as shown in detail in FIG. 2. Other components of FIG. 2 are deleted for clarity. Large driver transistors 36 and NOR gates 46 driving the gates of transistors 36 are shown separately from output buffers 30 to highlight their function.

The circuit of FIG. 3 detects when neighboring output buffers are switching and temporarily disables the large driver transistors of the output buffer. Although bounce in the noisy power and ground supplies can be coupled to output pin 10 through small driver transistors 34, the amount of coupling is smaller since these transistors are smaller than large driver transistors 36. Resistors 38 also significantly dampen any bounce on the supplies before reaching output pin 10.

Input-transition detector 50 receives inputs from each DIN input to each output buffer 30. When any of the inputs DIN-1, DIN-2, DIN-3 ... DIN-N, for N neighboring outputs transitions from high to low, detector 50 generates a high-going DP pulse.

The high-going DP pulse generated from detector 50 is sent to all neighboring output buffers 30. NOR gates 46 then disable large driver transistors 36, preventing noise from coupling into output pin 10 from the noisy power and ground supplies.

Neighbor sensing allows any output that is switching and injecting noise into the power or ground supplies to disable other output buffers for a short time. The same pulse generator, detector 50, is used to generate a pulse for isolating its own drivers and the neighbor's drivers. All pin's drivers are disabled at about the same time as the switching pin's driver is disabled, since the same pulse DP is used. Thus the neighbor's drivers are isolated when the ringing occurs.

Timing of Disabling Neighbor's Drivers—FIG. 4

FIG. 4 is a waveform diagram illustrating how an output transition on one pin disables drivers for other pins that are not changing to prevent noise coupling between pins. When bit 3 of a data bus is to change from high to low, the DIN input to the bit-3 output buffer, DIN-3, is driven low. Detector 50 of FIGS. 2, 3 detects the low-going change on DIN-3 and generates a DP pulse. The bit-3 output buffer drives a high voltage onto the gate of the pull-down small driver transistor, causing the output, DOUT-3, to begin to drop in voltage.

The gate of the large driver transistor is also driven high initially, since the DP pulse takes longer to generate than the delay from DIN-3 to the gate of the large driver transistor. However, when the DP pulse is generated, the gate of the large driver transistor is driven low, disabling the large driver transistor. Thus the DP pulse disables the large driver transistor after the output DOUT-3 begins to slew, but before the output reaches ground and before the first reflection is returned.

The DP pulse generated by the DIN-3 input is also sent to all other pins in the neighbor group. As an example, bit 5 is also shown in FIG. 4. DIN-5 remains in a constant low state during this time, and the output DOUT-5 likewise remains at ground. However, some ground-bounce noise from the slewing output DOUT-3 is generated and coupled into DOUT-5. This noise coupled in appears as a slight waving of the voltage of DOUT-5 above and below absolute ground.

The DP pulse generated by DIN-3 switching is also sent to the output buffer driving DOUT-5. The large driver transistor for DOUT-5 is also disabled by the DP pulse, even though DOUT-5 is not switching. Disabling other, non-switching, outputs prevents more noise coupling from occurring.

While such neighbor sensing is useful, speed requirements can limit the number of output buffers that can be sensed together to perhaps only 4 neighboring pins. When large busses of 16 or more outputs are used, sensing only 4 of the 16 outputs reduces the effectiveness of the neighbor sensing. A faster sensing circuit is desired so that more outputs can be sensed together at a high speed. It is desired to sense at least 16 outputs together for neighbor sensing.

Often some control inputs other than the data inputs can affect the outputs. For example, an output-enable (OE) input may disable some or all of the outputs. When OE indicates that the outputs are disabled, neighbor sensing is not needed. Also, a latchenable (LE) signal may prevent changes in a data input from being immediately transmitted to an output. The neighbor-sensing pulse should be disabled when LE is in one state, but enabled for the other state of LE. Finally, the outputs may be latched by clocked flip-flop. Then changes in the data input do not affect the outputs until the next edge of the clock signal. When the clock transitions, all outputs may switch at the same time. Thus the clock edge should trigger a pulse to disable larger drivers in all outputs.

What is desired is an advanced neighbor sensing of many outputs. It is desired to sense changes on 16 neighboring outputs in a wide bus. It is further desired to enable and disable neighbor sensing as a logical function of control inputs such as latch-enable, output-enable, and clock signals. Faster neighbor sensing is desired.

SUMMARY OF THE INVENTION

A reduced-noise integrated circuit has a plurality of data inputs and a control input that generates a control signal. A plurality of output buffers drive output pins. Each output buffer includes a large driver transistor and a small driver transistor for driving an output pin to a state.

A local enable signal is in each of the plurality of output buffers. It indicates when the small driver transistor is to be enabled to drive the output pin. A plurality of detector slices each receives a data input in the plurality of data inputs. Each detector slice generates a local pulse when a transition of the data input is detected by the detector slice and the control input is in a first state, but it does not generate the local pulse in response to the transition of the data input when the control input is a second state.

First combining logic receives local pulses from some of the plurality of detector slices. It generates a first global pulse when any of the local pulses are received by the first combining logic. A second combining logic receives local pulses from others of the plurality of detector slices. It generates a second global pulse when any of the local pulses are received by the second combining logic.

Each of the plurality of output buffers contains a final combining logic that combines the first and second global pulses with the local enable signal to generate a local gate signal. The local gate signal is applied to a gate of the large driver transistor but is not applied to a gate of the small driver transistor. The large driver transistor is pulsed off by the local gate signal when one of the detector slices detects the transition of a data input and the control input is in the first state but not the second state. Thus neighbor sensing is disabled by the control input.

In further aspects of the invention a plurality of logic slices each receive one of the plurality of data inputs. Each logic slice generates an intermediate signal to an output buffer. Each logic slice includes a buffer for buffering the data input, a latch for storing the data input, and a multiplexer. The mux receives an output from the buffer and an output from the latch and the control signal. It couples an output of the buffer to the intermediate signal when the control input is in the first state, but it couples an output of the latch to the intermediate signal when the control input is in the second state. Each of the plurality of output buffers receives an intermediate signal from a different logic slice. Thus the control input enables the latch in the plurality of logic slices and disables generating the local pulses by the detector slices.

In further aspects a clock input is received by a clock detector slice. It generates a local control pulse when a transition of the clock input is detected by the clock detector slice. The first combining logic also receives the local control pulse from the clock detector slice. The first combining logic also generates the first global pulse when the local control pulse is received. Thus the large driver transistors are also pulsed off when the transition of the clock input is detected.

BRIEF DESCRIPTION OF THE DRAWINGS

FIG. 1 is a diagram of a waveform of a prior-art high-drive output buffer driving a PCB wiring trace.

FIG. 2 is a schematic diagram of a prior-art output buffer that disables the larger driver transistor using a pulse generator.

DETAILED DESCRIPTION

The present invention relates to an improvement in output buffer noise reduction. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that better noise reduction can result when more outputs of a wide bus are sensed in neighbor sensing. A faster transition detector is needed to combine the additional outputs to generate the disabling pulses. The inventor has realized that one single pulse does not have to be generated. Instead, several pulses can be generated and combined at each output. This may reduce propagation delays.

The inventor has further realized that the neighbor-sensing logic can also receive inputs from control signals rather than just from data inputs. The control signals may cause many or all outputs to change at the same time. Thus by including control inputs into the neighbor-sensing detector, noise suppression for additional situations can be provided for.

Latching or clocking of the data inputs may also affect neighbor sensing. The inventor realizes that the neighbor-sensing detector can be modified to logically operate on the data inputs to reflect the control inputs.

Figure 3:
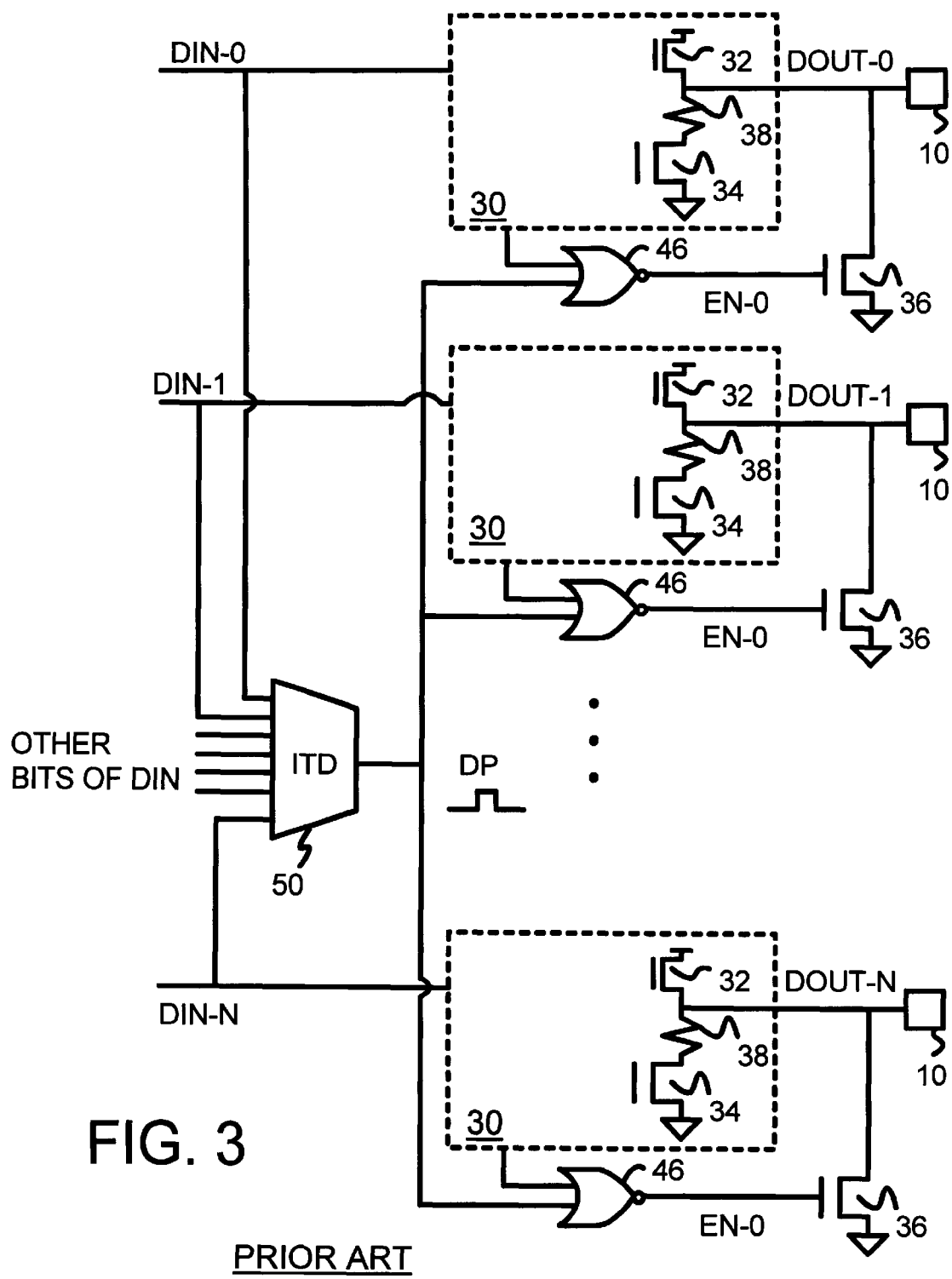
FIG. 3 illustrates a group of neighboring output buffers that generate disabling pulses for all outputs when any output is driven low.
Figure 4:
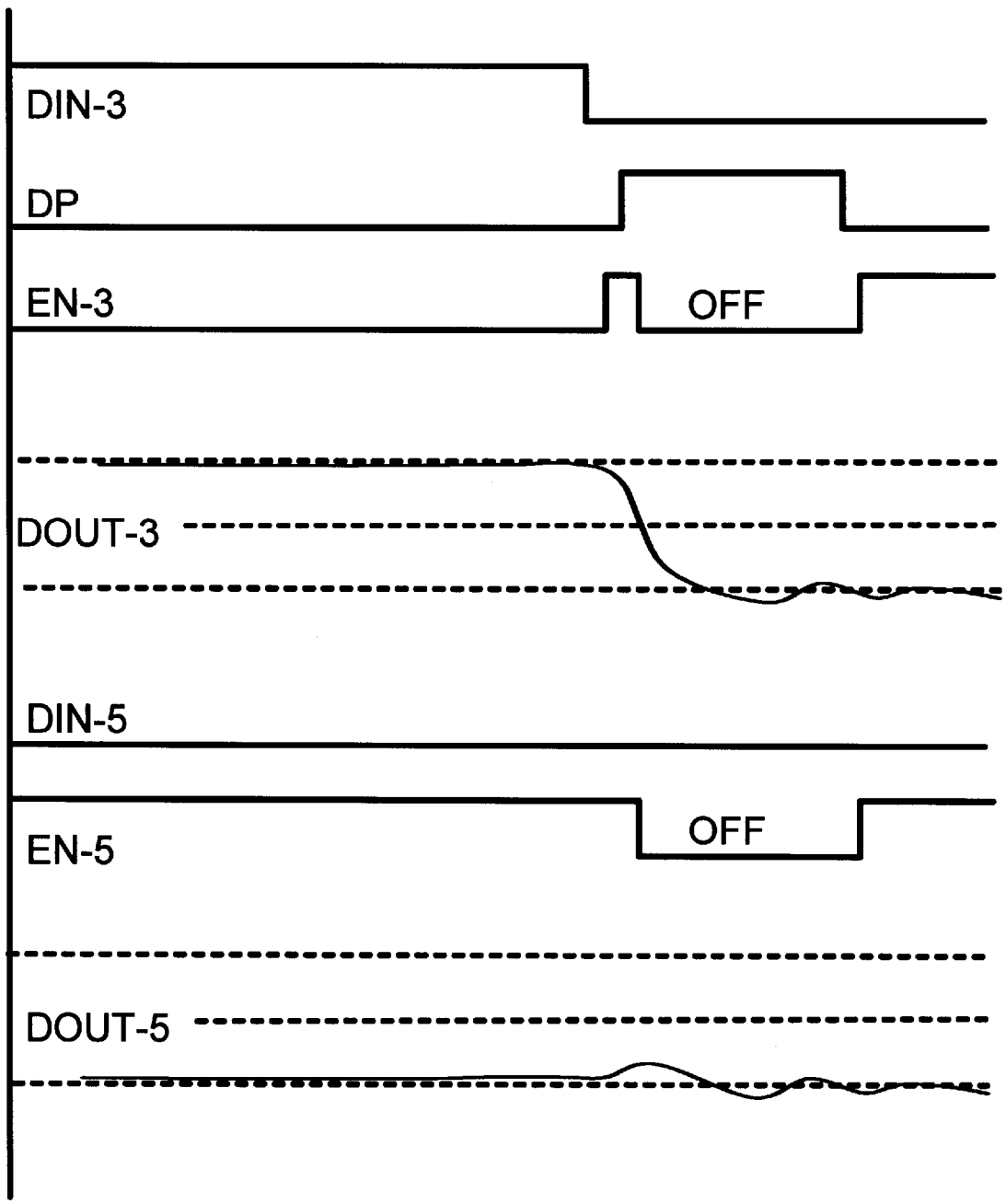
FIG. 4 is a waveform diagram illustrating how an output transition on one pin disables drivers for other pins that are not changing to prevent noise coupling between pins.
Figure 5:
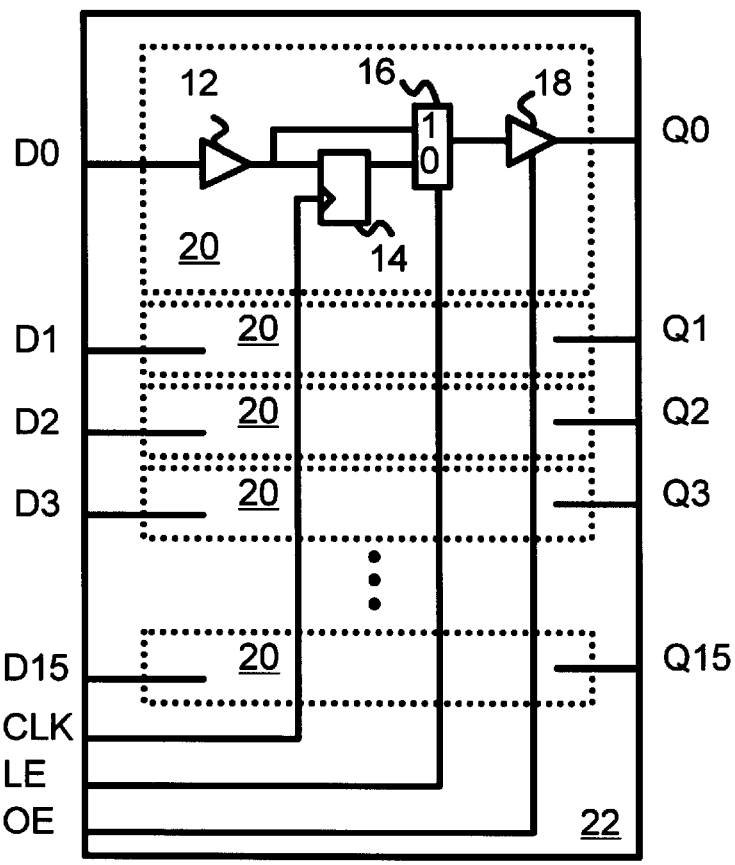
FIG. 5 shows a CMOS buffer chip with control inputs.

Control Inputs to Buffer Chip—FIG. 5

FIG. 5 shows a CMOS buffer chip with control inputs. Chip 22 has a wide input bus of 16 data inputs DIN0 to DIN15 that are buffered by chip 22 to generate 16 data outputs Q0 to Q15. Each bit-slice buffer 20 buffers the DIN input with input buffer 12, clocks the data input with flip-flop 14, selects either the latched or unlatched data with mux 16, and drives the external Q output with driver 18.

Driver 18 for each of the 16 bit-slice buffers 20 is controlled by control input OE, output enable. When OE is high, drivers 18 are enabled, but when OE is low, drivers 18 are disabled and the Q outputs are in a high-impedance state.

Clock control input CLK is applied to the clock inputs of flip-flops 14 in each of the 16 bit-slice buffers 20. When CLK rises, flip-flops 14 latch their data inputs from input buffers 12.

Latch-enable control input LE is used to select either transparent or clocked buffering by all of the 16 bit-slice buffers 20. When LE is high, muxes 16 select the unlatched data input from input buffer 12. However, when LE is low, muxes 16 select the clocked data from flip-flops 14. The output from flip-flops 14 can change only at the rising edge of clock control input CLK.

Thus when LE is high, and OE is high, changes to the data inputs DIN are immediately transmitted to the data outputs Q. However, when LE is low, and OE is still high, changes in the data inputs DIN are transmitted to the Q outputs only after the rising edge of clock CLK. When OE is low, all data-input changes are blocked from the outputs.

Figure 6:
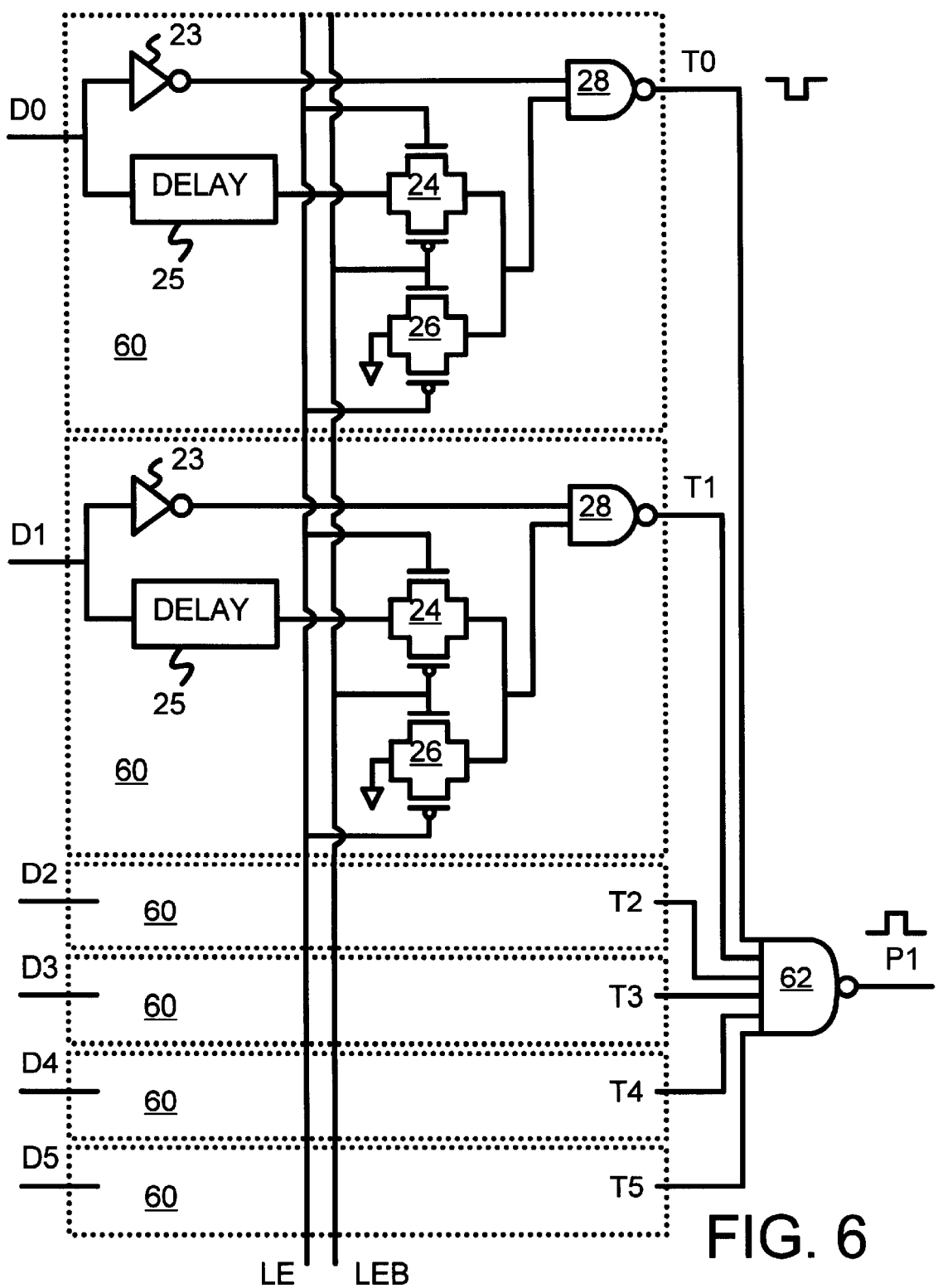
FIG. 6 shows a front-end of a transition detector for neighbor sensing that disables data-input detection in response to a control input.

Transition Detector With Control-input Muxing—FIG. 6

FIG. 6 shows a front-end of a transition detector for neighbor sensing that disables data-input detection in response to a control input. Each detector slice 60 receives a data input from an input buffer 12 of FIG. 5. The data input D0 . . . D5 is split to inverter 23 and to delay element 25. Transmission gates 24, 26 act as a mux controlled by latch-enable signal LE and its inverse LEB. When LE is high and LEB low, transmission gate 24 passes the delayed data input from delay element 25 to an input of NAND gate 28. The other input to NAND gate 28 is from inverter 23. Since inverter 23 inverts the data input, while delay element 25 and transmission gate 24 do not invert, in steady-state the two inputs to NAND gate 28 are always opposite, either 0 and 1, or 1 and 0. NAND gate 28 outputs a high (1) in steady state.

However, when the data input transitions from high to low, the extra path delay through delay element 25 and transmission gate 24 relative to inverter 23 causes NAND gate 28 to generate a low-going pulse. The low-going data input quickly passes through inverter 23 to produce a high on the input to NAND gate 28, while the other input from transmission gate 24 is already low. The 1,1 inputs to NAND gate 28 cause it to output a low. Eventually the data input's transition to low is propagated through delay element 25 and transmission gate 24 as a low (0) to the lower input of NAND gate 28, and the output of NAND gate 28 again goes high, ending the pulse.

The width of the pulse depends on the difference in the path delay through inverter 23 compared with the path delay through delay element 25 and transmission gate 24. Delay element 25 could be a string of an even number of inverters, or an R-C element, or other kinds of delay-generating components such as a transistor series operating in the linear region.

When LE is low, and LEB is high, the flip-flops 14 (FIG. 5) are enabled so that the clocked data inputs are selected. Since changes in the data inputs are not immediately propagated to the outputs in that case, data-input detection is disabled in detector slices 60. The low LE and high LEB turns off transmission gate 24 but turns on transmission gate 26. A low signal is hard-wired to the input of transmission gate 26, applying a low to NAND gate 28. The low input to NAND gate 28 forces its output to remain high regardless of any transitions on the data input DIN that are applied by inverter 23 to the upper input of NAND gate 28.

Thus low-going input transitions of data inputs DIN0:5 generate a low-going pulse from NAND gate 28 when LE is high, but no pulses are generated when LE is low. The pulses from NAND gates 8 of each detector slice 60 are labeled T0 to T5 and are input to NAND gate 62. NAND gate 62 is a 6-input NAND gate that generates a high-going pulse on its P1 output when any low-going pulse is input on the T1–T5 inputs.

Figure 7:
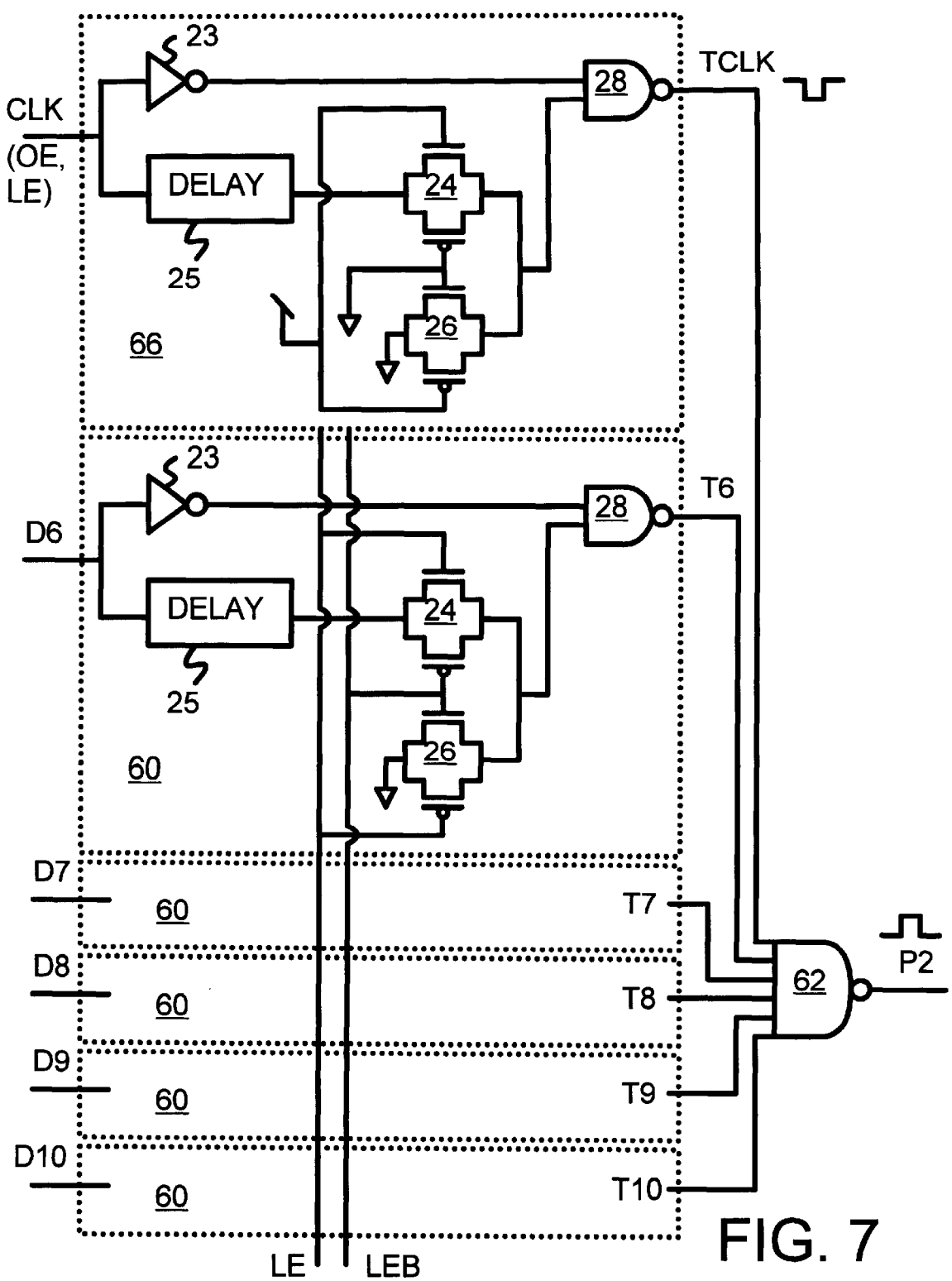
FIG. 7 shows a control input to a detector slice in the front-end of a transition detector for neighbor sensing.

Control Inputs to Transition Detector—FIG. 7

FIG. 7 shows a control input to a detector slice in the front-end of a transition detector for neighbor sensing. Data inputs D6 to D10 are applied to detector slices 60 to produce low-going pulse outputs T6 to T10 that are input to five of the six inputs of NAND gate 62. NAND gate 62 generates a second high-going pulse output P2.

Control-input detector slice 66 receives one of the control inputs CLK, LE, or OE rather than a data input. In FIG. 7, the detector slice 66 receives signal CLK, while two other blocks receive LE and OE, along with other data inputs D11 to D15. These other two detector blocks generate pulse signals P3 and P4.

While latch-enable signal LE controls transmission gates 24, 26 in data detector slices 60, the LE, LEB signals are not connected to transmission gates 24, 26 in control-input detector slice 66. Instead, the internal cell signals for LE, LEB within control-input detector slice 66 are hard-wired to power and ground, respectively. This hard-wire connection of the gates of the p-channel and n-channel transistors in transmission gates 24, 26 causes transmission gate 24 to always be enabled, while transmission gate 26 is always closed.

When control input CLK goes low, NAND gate 28 in control-input detector slice 66 generates a low-going pulse on its output TCLK. When a pulse is desired on the rising edge of CLK, an extra inverter (not shown) can be applied to signal CLK before it is input to control-input detector slice 66, or a second control-input detector slice 66 can be used with an inverted CLK input.

Output TCLK is input to NAND gate 62. When CLK falls, NAND gate 28 generates a low-going pulse TCLK, which causes NAND gate 62 to generate a high-going pulse P2.

Figure 8:
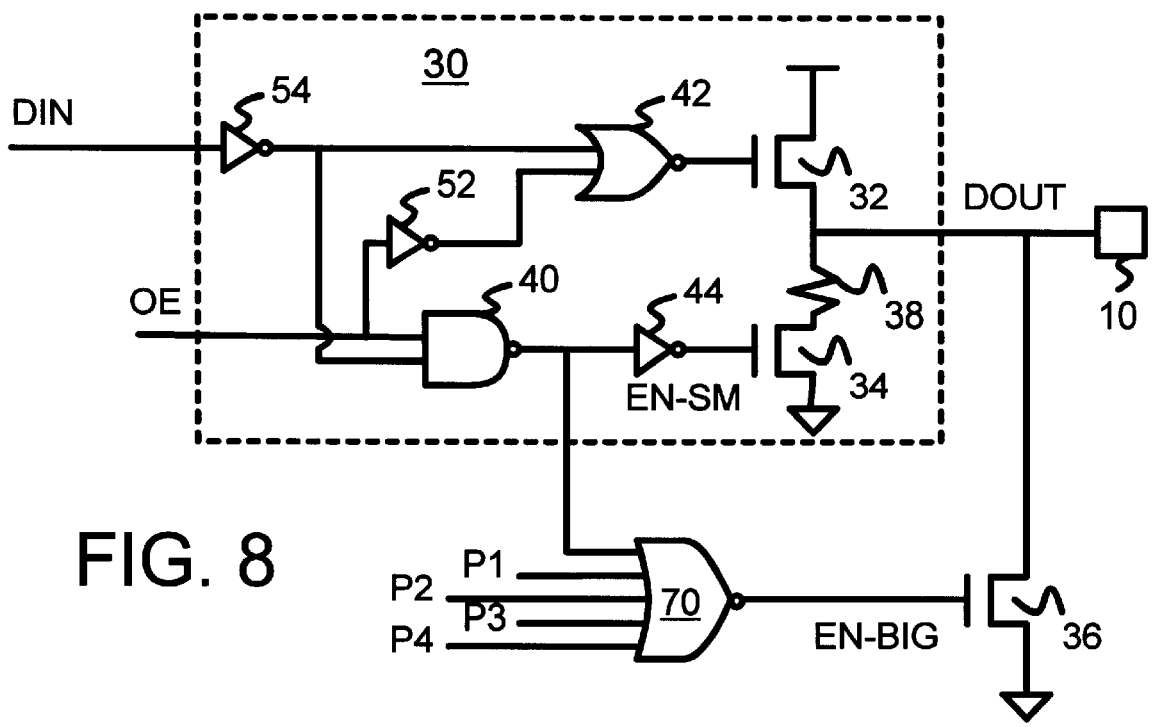
FIG. 8 is a diagram of the output buffer that combines detector pulses to disable the larger driver transistor.

Final Pulse Combination at Each Output—FIG. 8

FIG. 8 is a diagram of the output buffer that combines detector pulses to disable the larger driver transistor. NOR gate 70 receives the P1, P2, P3, and P4 pulses from the detector. For example, P1 is generated by the detector of FIG. 6 while P2 is generated by the detector of FIG. 7. Two other detectors similar to that in FIG. 7 produce pulses P3 and P4, but substitute OE and LE for the CLK control input, and substitute other data inputs.

When any of pulses P1–P4 pulse high, NOR gate 70 pulses its output EN-BIG low. This disables large driver transistor 36 for a brief period of time while the other input and output is changing. Large driver transistor 36 is thus pulsed off by a pulse generated by the input-transition detector. When a data input DIN0:15 or a control input changes from high to low, the detector generates a pulse P1–P4. This pulse is a high-going pulse.

Other neighboring output buffers (not shown) similar to output buffer 30 also receive the P1, P2, P3, P4 pulses from detectors such as shown in FIGS. 6, 7. These other output buffers also have large driver transistors 36 that are pulsed off when one of the P1, P2, P3, P4 lines pulse high. Any high-going transition of any P1–P4 generated by any neighboring pin (data or control) generates the pulse and disables large driver transistors for all neighboring outputs. Each output buffer 30 is provided with its own large driver transistor 36 and its own NOR gate 70 to locally generate the driver-gate node EN-BIG.

An internal input signal DIN is buffered by inverter 54, which drives NOR gate 42 and NAND gate 40. An output enable OE signal is also input to NAND gate 40. Inverter 52 inverts OE for input to NOR gate 42. When OE is low, output buffer 30 is disabled and does not drive output pin 10.

NOR gate 42 drives n-channel pull-up transistor 32, which drives DOUT output pin 10 high when DIN is high and OE is high. Only one pull-up transistor is provided because power-supply ringing is not as problematic as is ground bounce. However, two pull-down drivers are used: large driver transistor 36 and small driver transistor 34.

Output pin 10 is driven by the drain of large driver transistor 36 and by the drain of smaller driver transistor 34 through resistor 38. During and immediately after the later part of the voltage transition, when ringing occurs, large driver transistor 36 is disabled so that only small driver transistor 34 is enabled. Only small driver transistor 34 continues to drive the output low until ground is reached. Resistor 38 increases the output impedance, helping to absorb reflections.

Small driver transistor 34 acts as a dynamic driver transistor, being used during voltage slewing, while larger driver transistor 36 is used as a static driver to supply a large D.C. current sink after the output voltage has completed its swing.

The output from NAND gate 40 is inverted by inverter 44 and drives the gate of small driver transistor 34. The output of NAND gate 40 is also input to NOR gate 70, which drives the gate of large driver transistor 36.

Resistor 38 is in series with the output and thus serves to increase the output impedance. The higher output impedance helps dampen reflected waves and reduce ringing. Resistor 38 is sized to provide a matching impedance to the characteristic impedance of the wiring trace attached to output pin 10.

Dynamic Impedance Switching

The impedance of the output buffer is dynamically changed or tuned as the output voltage changes. Initially, both the large and small driver transistors 34, 36 are driving, and the large size of the large driver transistor 36 provides a low impedance and high current drive to rapidly switch the voltage to about the TTL-logic switching threshold, 1.5 volts. Then the larger driver transistor 36 is pulsed off, and the impedance increases to the larger impedance of the small driver transistor 34 and resistor 38. Thus higher impedance is provided near the end of the output voltage transition, before ringing occurs. The resistor in the higher impedance stage absorbs the reflected waves, reducing ringing. Finally the P1–P4 pulse ends and large driver transistor 36 is again enabled, lowering the impedance. Thus the output buffer's impedance is switched by the pulse.

Large driver transistor 36 is connected to a noisy ground, while small driver transistor 34 is connected to a quiet ground. Internal signals and components such as inverters 44, 52, 54, and NOR gates 42, 70 and NAND gate 40 are connected to separate, quiet supplies to minimize the effects of ground bounce. The gates of the driver transistors are driven from the quiet supplies, minimizing bounce-induced ringing.

Both stages drive the output during the initial part of the voltage transition. Both stages contribute to driving the output during the speed-critical first portion of the output swing. The higher impedance of the small driver transistor is seen at the end of the voltage transition when ringing occurs. The small driver transistor 34 and resistor 38 act as active termination of the PCB wiring trace connected to output pin 10.

Figure 9:
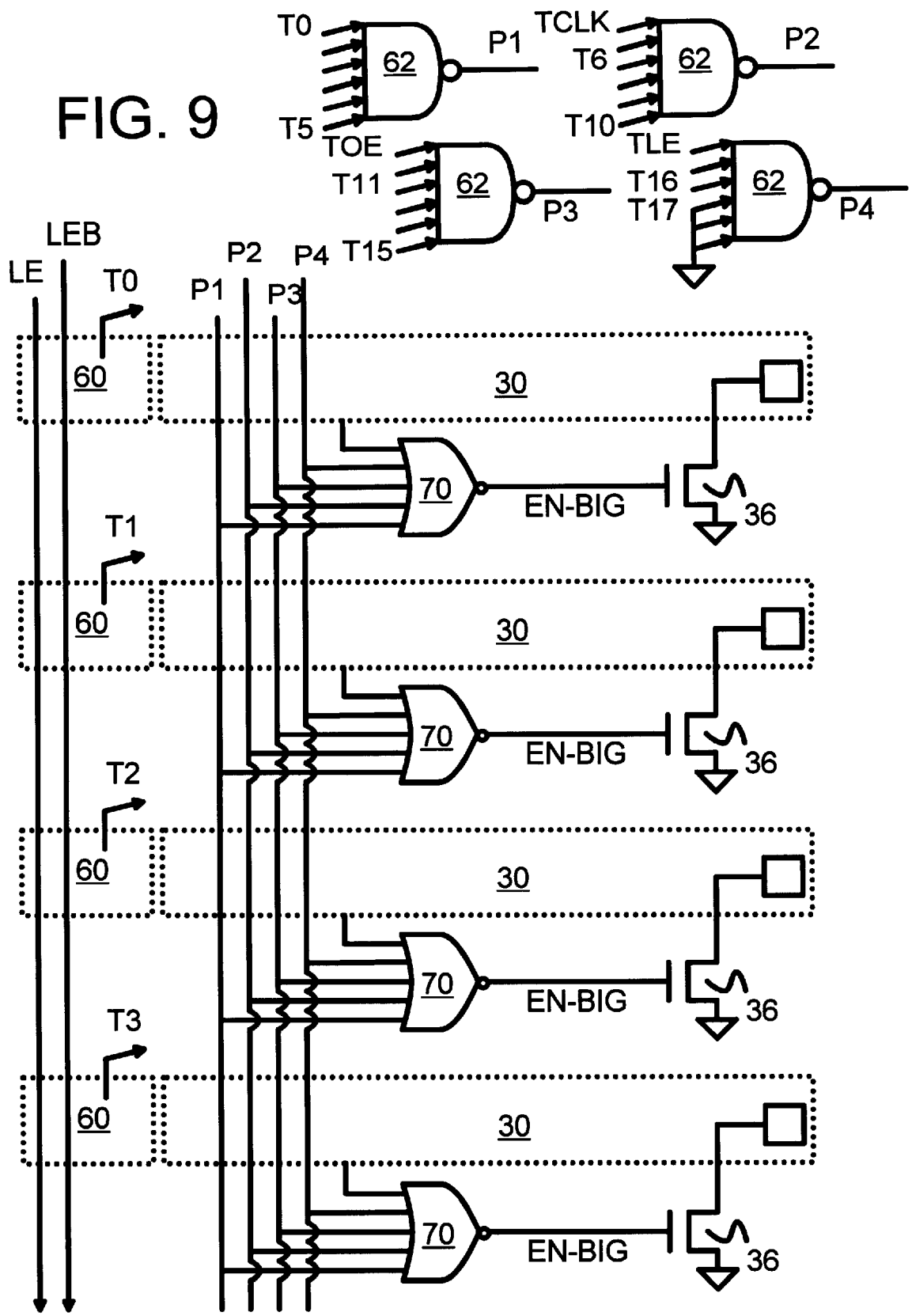
FIG. 9 illustrates that the transition detector can be integrated with the output buffer.

Detector Integrated with Output Buffer—FIG. 9

FIG. 9 illustrates that the transition detector can be integrated with the output buffer. A few bit-slices of the transition detector and output buffer are shown. Output buffers 30 each drive a different data-output pad. Each output buffer 30 also has a large driver transistor 36 connected to its output pad, as well as internal drivers as shown in FIG. 8. Each large driver transistor 36 is driven by a NOR gate 70. Pulse lines P1, P2, P3, P4 are routed across each output buffer 30 to each NOR gate 70.

Each of the four pulse lines P1–P4 is generated by a different NAND gate 62. Pulse P1 is generated by a NAND gate 62 that receives pulse signals T0–T5 from detector slices 60 for data inputs DIN0 to DIN5 (See FIG. 6). Pulse P2 is generated by a NAND gate 62 that receives pulse signals TCLK and T6–T10 from detector slices 60 for the clock control input and data inputs DIN6 to DIN10 (See FIG. 7). Pulse P3 is generated by a NAND gate 62 that receives pulse signals TOE and T1–T15 from detector slices 60 for the output-enable control input and data inputs DIN 11 to DIN 15. Pulse P4 is generated by a NAND gate 62 that receives pulse signals TLE and T16–T17 from detector slices 60 for the latch-enable control input and data inputs DIN16 to DIN17.

Detector slices 60 can be located within each bit slice for a particular data input/output. For example, for DIN0, its detector slice 60 that generates T0 can be located in front of its output buffer 30 for output Q0. These detector slices 60 are shown on the left of FIG. 9. Since each detector slice 60 receives the latch-enable LE and its complement LEB, the LE and LEB lines are routed across each detector slice 60.

In the actual buffer chip, many additional output buffers 30 and detector slices 60 are present for the other data bits. Also, control-input detector slices 66 (not shown) are used to generate TCLK, TOE, and TLE, as well as buffers for the internal clock, latch, and OE signals.

The detector with detector slices 60 can thus be laid out as a distributed detector for neighbor sensing. An area-efficient layout can result in cost savings.

Figure 10:
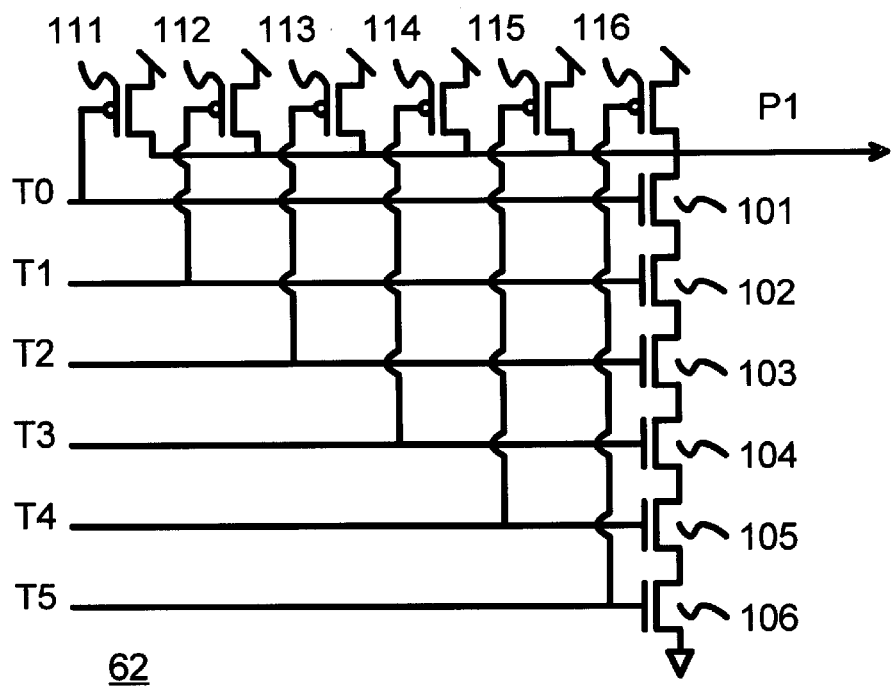
FIG. 10 is a detailed schematic of a NAND gate that generates the pulses P1–P4.

FIG. 10 is a detailed schematic of NAND gate 62 that generates the pulses P1–P4. Inputs T0 to T5 from detector slices 60 for data inputs DIN0–DIN5 are applied to the gates of p-channel transistors 111–116 and n-channel transistors 101–106. Of course, other NAND gates 62 that generate pulses P2–P4 have different transition T inputs.

The series connection of n-channel transistors 102–106 makes the low-going edge of output P1 slower than the high-going edge. Since P1 is a high-going pulse, this skew tends to make the pulse wider (longer). However, the beginning edge of the pulse is the fastest edge, so transition detection is accelerated.

Figure 11:
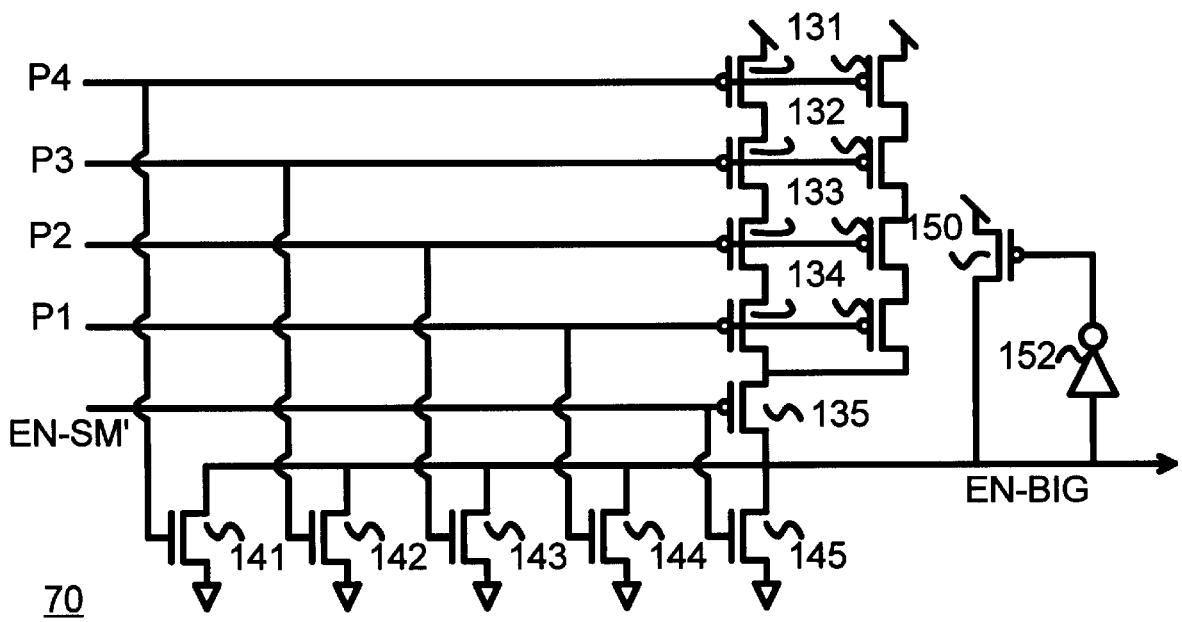
FIG. 11 is a detailed schematic of a NOR gate that drives the gate of the large driver.

FIG. 11 is a detailed schematic of NOR gate 70 that drives the gate of the large driver. Output signal EN-BIG from NOR gate 70 drives the gate of the large driver transistor.

NOR gate 70 receives the four pulse lines P1–P4. NOR gate 70 also receives the local enable signal EN-SM' from NAND gate 40 of output buffer 30 of FIG. 8. When EN-SM' is high, the local output buffer 30 is driving its pad high or is in the high impedance state. The high EN-SM' drives the output of NOR gate 70 low, turning off the large driver transistor regardless of the pulse inputs P1–P4.

Local signal EN-SM' is applied to the gates of n-channel transistor 145 and p-channel transistor 135. Pulse signal P1 is applied to the gates of n-channel transistor 144 and p-channel transistors 134. Pulse signal P2 is applied to the gates of n-channel transistor 143 and p-channel transistors 133. Pulse signal P3 is applied to the gates of n-channel transistor 142 and p-channel transistors 132 while pulse signal P4 is applied to the gates of n-channel transistor 141 and p-channel transistors 131. Two parallel chains of p-channel transistors 131–134 are used to speed up the rising delay.

Keeper p-channel transistor 150 has its gate driven by inverter 152, which is connected to the output EN-BIG of NOR gate 70. Keeper transistor 150 improves the rise time of output EN-BIG.

NOR gate 70 has a fast fall time, but a slower rise time, due to the series connection of p-channel transistors 131–135. Since a transition of a data or control input generates a positive high-going pulse on lines P1–P4, the leading edge of the pulse is accelerated while the trailing edge is delayed. This increases the pulse width, keeping the large driver transistor disabled for a slightly longer period of time. However, the delay to disable the large driver transistor is accelerated by the skew of NOR gate 70.

ADVANTAGES OF THE INVENTION

Often some control inputs may negate the need for neighbor sensing. For example, a latch-enable (LE) signal may prevent changes in a data input from being immediately transmitted to an output. The neighbor-sensing pulse is when LE is in one state, but enabled for the other state of LE. The outputs can be latched by clocked flip-flop. Then changes in the data input do not affect the outputs until the next edge of the clock signal. When the clock transitions, all outputs may switch at the same time. Thus the clock edge triggers a pulse to disable larger drivers in all outputs.

Advanced neighbor sensing of many outputs is possible. Changes on 16 neighboring outputs in a wide bus can be sensed. Neighbor sensing is enabled and disabled as a logical function of control inputs such as latch-enable, output-enable, and clock signals. Faster neighbor sensing is achieved.

Locating the control muxing logic in the delayed path of the detector slice after the delay element does not increase delay to generation of the pulse. This is an advantage since the pulse is generated as quickly as possible.

ALTERNATE EMBODIMENTS

Several other embodiments are contemplated by the inventor. For example, the timing of the disabling pulse can be adjusted. For very low noise and light loading applications, the larger driver can be disabled for the full duration of the output transition.

The embodiments described herein use separate pull-down transistors, but only one pull-up transistor, since power-supply bounce is less of a problem in today's circuits. However, separate larger and smaller pull-up transistors can also be used. Separate pulse generators can be used for disabling the large pull-up and pull-down driver transistors to compensate for larger ground ringing or bounce.

Control inputs can be added to modify the outputs buffers described herein for three-state or high-Z operation. When the entire buffer is disabled, both pull-up and pull-down transistors are disabled. Changing inverters to a NAND gate driving the pull-ups and a NOR gate driving the pull-downs with additional disable circuitry for the second stage can accomplish this in a well-known manner.

The resistors in series with the smaller driver transistors can be implemented as diffusion resistors or as polysilicon resistors. Other technologies could also be used. The neighboring pins could be only the two immediately adjacent pins, or all pins sharing the same metal bus for power or ground, such as all pins on one side of a chip or between two ground pins.

Current may flow in either direction, as negative current can flow from ground to the power supply. Thus the pull-up can drive a positive current to the output while the pull-down can drive a negative current to the output. A single series resistor to the output can be used rather than two separate resistors as described.

Many variations of the bit-slice buffer in a buffer chip are possible. Transparent latches can replace clocked flip-flops. Inversion of data can occur. Inverted control signals can be employed. More complex logic can be used. Rather than connect all input transition detectors to all outputs, transition signals could be applied just to nearest neighbors, or to a subset of all pins.

An inverter can be added to the data input to the transition detector to allow the pulse to be generated for high-going rather than low-going input transitions. Two transition detectors can be used for one or more data or control inputs to allow the pulse to be generated for both edges of the input. Further logical combinatorial or even sequential logic can be employed before the transition detector for more complex cases.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A reduced-noise integrated circuit comprising:
    a plurality of data inputs;
    a control input generating a control signal;
    a plurality of output buffers for driving output pins, each output buffer including a large driver transistor and a small driver transistor for driving an output pin to a state;
    a local enable signal, in each of the plurality of output buffers, for indicating when the small driver transistor is to be enabled to drive the output pin;
    a plurality of detector slices, each detector slice receiving a data input in the plurality of data inputs, each detector slice for generating a local pulse when a transition of the data input is detected by the detector slice and the control input is in a first state, but for not generating the local pulse in response to the transition of the data input when the control input is a second state;
    first combining logic, receiving local pulses from some of the plurality of detector slices, for generating a first global pulse when any of the local pulses are received by the first combining logic; and
    second combining logic, receiving local pulses from others of the plurality of detector slices, for generating a second global pulse when any of the local pulses are received by the second combining logic;
    wherein each of the plurality of output buffers contains:
        final combining logic for combining the first and second global pulses with the local enable signal to generate a local gate signal, the local gate signal being applied to a gate of the large driver transistor but not applied to a gate of the small driver transistor;
    wherein the large driver transistor is pulsed off by the local gate signal when one of the detector slices detects the transition of a data input and the control input is in the first state but not the second state,
    whereby neighbor sensing is disabled by the control input.

2. The reduced-noise integrated circuit of claim 1 further comprising:
    plurality of logic slices, each receiving one of the plurality of data inputs, each logic slice generating an intermediate signal to an output buffer, each logic slice including:
        a buffer for buffering the data input;
        a latch for storing the data input;
        a multiplexer, receiving an output from the buffer and an output from the latch and the control signal, for coupling an output of the buffer to the intermediate signal when the control input is in the first state, but for coupling an output of the latch to the intermediate signal when the control input is in the second state;
    wherein each of the plurality of output buffers receives an intermediate signal from a different logic slice,
    whereby the control input enables the latch in the plurality of logic slices and disables generating the local pulses by the detector slices.

3. The reduced-noise integrated circuit of claim 2 further comprising:
    a clock input;
    a clock detector slice, receiving the clock input for generating a local control pulse when a transition of the clock input is detected by the clock detector slice;
    wherein the first combining logic also receives the local control pulse from the clock detector slice, the first combining logic also generating the first global pulse when the local control pulse is received, whereby the large driver transistors are also pulsed off when the transition of the clock input is detected.

4. The reduced-noise integrated circuit of claim 3 wherein storage of the data input by the latch is controlled by a clock signal generated from the clock input.

5. The reduced-noise integrated circuit of claim 4 wherein the latch is a flip-flop.

6. The reduced-noise integrated circuit of claim 5 wherein the control input is a latch-enable input for enabling latches.

7. The reduced-noise integrated circuit of claim 2 wherein each of the plurality of detector slices comprises:

a first buffer receiving a data input to generate a buffered data input;

a logic gate, receiving the buffered data input and generating the local pulse;

a delay element, receiving the buffered data input, for generating a delayed data input; and a disabler, receiving the delayed data input, the control input, and a constant signal, for outputting to the logic gate the delayed data input when the control input is in the first state, but for outputting to the logic gate the constant signal when the control input is in the second state;

wherein the constant signal causes the logic gate to not generate the local pulse.

8. The reduced-noise integrated circuit of claim 7 wherein the first buffer is an inverter.

9. The reduced-noise integrated circuit of claim 7 wherein the logic gate is a NAND gate and wherein the disabler is a multiplexer.

10. The reduced-noise integrated circuit of claim 7 wherein the plurality of output buffers include at least 16 outputs buffers for driving 16 output pins, whereby a wide bus is driven with neighbor-sensing of inputs to the wide bus.

11. A complementary metal-oxide-semiconductor (CMOS) buffer chip comprising: data inputs;

control inputs including a first control signal;

data outputs each driven by an output buffer;

each output buffer having:

an internal drive signal indicating when a data output is being driven low;

a large n-channel driver transistor, having a drain coupled to the data output, with a source coupled to a ground and a gate controlled by a large gate node, for sinking a large current to ground;

a small n-channel driver transistor, having a drain coupled to the data output, with a source coupled to the ground and a gate controlled by a small gate node, for sinking a small current to ground, the small current being smaller than the large current;

a NOR gate, receiving global disable lines and receiving the internal drive signal, for generating the large gate node to control the large n-channel driver transistor;

wherein the small n-channel driver transistor remains on but the large n-channel driver transistor is turned off by the global disable lines when the internal drive signal indicates that the data output be driven low;

a pullup transistor, having a drain coupled to the data output, with a source coupled to a power supply and a gate, for sourcing a current to the data output;

a plurality of bit detectors, one bit detector for each of the data inputs, each bit detector receiving a data input being one bit of the data inputs, for generating a pulse on a disable bit signal in response to a transition of the data input when the first control signal is in a first state, but not generating the pulse on the disable bit signal when the transition occurs when the first control signal is not in the first state; and a plurality of NAND gates, each NAND gate receiving the disable bit signals from several of the bit detectors, each for outputting a global disable line, each NAND gate generating a pulse on the global disable line when a pulse is received by the NAND gate from a bit detector on the disable bit signals;

whereby detected transitions disabled the large n-channel driver transistors but not the small n-channel driver transistors.

12. The CMOS buffer chip of claim 11 further comprising:

a plurality of data cells, each data cell receiving one bit of the data inputs, each data cell including a latch, each data cell outputting the data input to an output buffer when the first control signal is in the first state, but outputting the data input after latching by the latch to the output buffer when the first control signal is not in the first state, whereby the first control signal activates data latching and disables the pulse from the bit detectors.

13. The CMOS buffer chip of claim 12 further comprising:

a plurality of control detectors, each receiving one of the control inputs, for generating a pulse on a disable bit signal in response to a transition of the control input;

whereby control signals and data signals disable the large n-channel driver transistors.

14. The CMOS buffer chip of claim 13 wherein the plurality of NAND gates receive at least 16 disable bit signals from 16 data inputs, whereby data transitions on a wide bus are detected.

15. The CMOS buffer chip of claim 14 wherein a pulse is generated on a disable bit signal for a low-going transition but not for a high-going transition of a data input.

16. The CMOS buffer chip of claim 15 wherein each of the bit detectors comprises:

a first buffer receiving a data input to generate a buffered data input;

a logic gate, receiving the buffered data input and outputting the disable bit signal, for generating the pulse on the disable bit signal;

a delay element, receiving the buffered data input, for generating a delayed data input; and a mux, receiving the delayed data input, the control input, and a constant signal, for outputting to the logic gate the delayed data input when the first control signal is in the first state, but for outputting to the logic gate the constant signal when the first control signal is not in the first state;

wherein the constant signal causes the logic gate to not generate the pulse.

17. A buffer chip with reduced ground bounce comprising:

data inputs;

a control input;

output buffer means for driving output pins, each output buffer means for driving an output pin, each output buffer means including a large driver transistor and a small driver transistor;

local enable signal means, in each output buffer means, for indicating when the small driver transistor is to be enabled to drive the output pin;

detector slice means, receiving a data input, each detector slice means for generating a local pulse when a transition of the data input is detected by the detector slice means and the control input is in a first state, but for not generating the local pulse in response to the transition of the data input when the control input is a second state;

first combining logic means, receiving local pulses from the detector slice means, for generating a first global pulse when any of the local pulses are received by the first combining logic means; and second combining logic means, receiving local pulses from the detector slice means, for generating a second global pulse when any of the local pulses are received by the second combining logic means;

wherein each output buffer means contains:
final combining logic means for combining the first and second global pulses with the local enable signal means to generate a local gate signal, the local gate signal being applied to a gate of the large driver transistor but not applied to a gate of the small driver transistor;

wherein the large driver transistor is pulsed off by the local gate signal when the detector slice means detects the transition of a data input and the control input is in the first state but not the second state, whereby neighbor sensing is disabled by the control input.

18. The buffer chip with reduced ground bounce of claim 17 further comprising:

logic slice means, each receiving one of the plurality of data inputs, for generating an intermediate signal to an output buffer means, each logic slice means including:
buffer means for buffering the data input;
latch means for storing the data input;
multiplexer means, receiving an output from the buffer means and an output from the latch means and the control signal, for coupling an output of the buffer means to the intermediate signal when the control input is in the first state, but for coupling an output of the latch means to the intermediate signal when the control input is in the second state;

wherein each of the plurality of output buffers means receives an intermediate signal from a different logic slice means, whereby the control input enables the latch means in the logic slice means and disables generating the local pulses by the detector slice means.

19. The buffer chip with reduced ground bounce of claim 18 further comprising:

a clock input;

clock detector slice means, receiving the clock input, for generating a local control pulse when a transition of the clock input is detected by the clock detector slice means;

wherein the first combining logic means also receives the local control pulse from the clock detector slice means, the first combining logic means also generating the first global pulse when the local control pulse is received, whereby the large driver transistors are also pulsed off when the transition of the clock occurs.

20. The buffer chip with reduced ground bounce of claim 19 wherein the detector slice means comprises:

first buffer means, receiving a data input, for generating a buffered data input;

logic gate means, receiving the buffered data input, for generating the local pulse;

delay means, receiving the buffered data input, for generating a delayed data input; and disable means, receiving the delayed data input, the control input, and a constant signal, for outputting to the logic gate means the delayed data input when the control input is in the first state, but for outputting to the logic gate means the constant signal when the control input is in the second state;

wherein the constant signal causes the logic gate means to not generate the local pulse.

* * * * *